United States Patent
Koga et al.

(10) Patent No.: US 6,683,491 B2
(45) Date of Patent: Jan. 27, 2004

(54) SEMICONDUCTOR INTEGRATED CIRCUIT (75) Inventors: Toru Koga, Kawasaki (JP); Shinya Fujioka, Kawasaki (JP); Katsuhiro Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/106,107

(22) Filed: Mar. 27, 2002

(65) Prior Publication Data
US 2003/0098741 A1 May 29, 2003

(30) Foreign Application Priority Data
Nov. 28, 2001 (JP) ........................................ 2001-362489

(51) Int. Cl.$^7$ .............................. G05F 1/10; G05F 3/02
(52) U.S. Cl. ........................ 327/544; 365/226; 327/538
(58) Field of Search ................................ 327/198, 544, 327/545, 532; 365/185.18, 226, 227; 307/43, 44

(56) References Cited

U.S. PATENT DOCUMENTS 6,041,012 A * 3/2000 Banba et al. ................ 365/226
6,373,321 B1 * 4/2002 Yamauchi et al. ........... 327/534
2001/0043493 A1 11/2001 Fujioka et al. ......... 365/189.09

* cited by examiner

Primary Examiner—Terry D. Cunningham
Assistant Examiner—Quan Tra
(74) Attorney, Agent, or Firm—Arent Fox Kintner Plotkin & Kahn, PLLC (57) ABSTRACT First and second voltage generators generate a first internal power supply voltage to be supplied to a first internal power supply line and a second internal power supply voltage to be supplied to a second internal power supply line, respectively. A short circuit shorts the first and second internal power supply lines when operations of both the first and second voltage generators are suspended. The first and second internal power supply lines become floating, and charges stored in the respective internal power supply lines drain out gradually. Here, since the charges are redistributed to both of the internal power supply lines, the first and second internal power supply voltages become equal in value as they drop off. Consequently, the first and second internal power supply voltages can be prevented from inversion, and internal circuits connected to both the first and second internal power supply lines can be precluded from malfunctioning.

8 Claims, 8 Drawing Sheets

Fig. 1

Prior Art

SEMICONDUCTOR INTEGRATED CIRCUIT

BACKGROUND OF THE INVENTION

1. Field of the Invention

The present invention relates to a semiconductor integrated circuit having a plurality of types of voltage generators. The present invention also relates to a semiconductor integrated circuit having a plurality of operation modes.

2. Description of the Related Art

Recently, portable equipment which operates on batteries is becoming common. Semiconductor integrated circuits to be implemented in such portable equipment must be of low power consumption for the sake of extended use time of the batteries. This kind of semiconductor integrated circuit therefore contains a voltage generator for generating an internal power supply voltage lower in voltage than the external power supply voltage. The internal power supply voltage is supplied to internal circuits of the semiconductor integrated circuit to achieve low power consumption. In addition, such semiconductor integrated circuits as a DRAM have a voltage generator that generates a boosted voltage (internal power supply voltage) for word lines. That is, a plurality of types of internal power supply voltages generated by a plurality of types of voltage generators are supplied to a plurality of internal circuits, respectively.

Furthermore, in this kind of semiconductor integrated circuit, the voltage generators are made of a plurality of units having different capabilities. The units to be operated are switched in accordance with the operation mode, thereby achieving low power consumption. For example, in a DRAM, units of greater capabilities are operated in an active mode where read operations and write operations are performed (when word lines are selected). In a standby mode where no available command is supplied (when no word line is selected), units of smaller capabilities are operated. Moreover, in a power-down mode (low power consumption mode), operations of all the units are suspended and the generation of the internal power supply voltages is stopped. Here, latch circuits and the like that need to retain data are exclusively supplied with the external power supply voltage while the other circuits stop operating. The power consumption hence lowers further.

As described above, the generation of the internal power supply voltages is stopped in the power-down mode. Thus, when the semiconductor integrated circuit shifts its state from the standby mode or the active mode to the power-down mode, internal power supply lines for supplying the internal power supply voltages become floating. On this occasion, the charges trapped in the internal power supply lines are gradually drained out to a ground line through leak paths. That is, the internal power supply voltages drop gradually.

Figure 1:
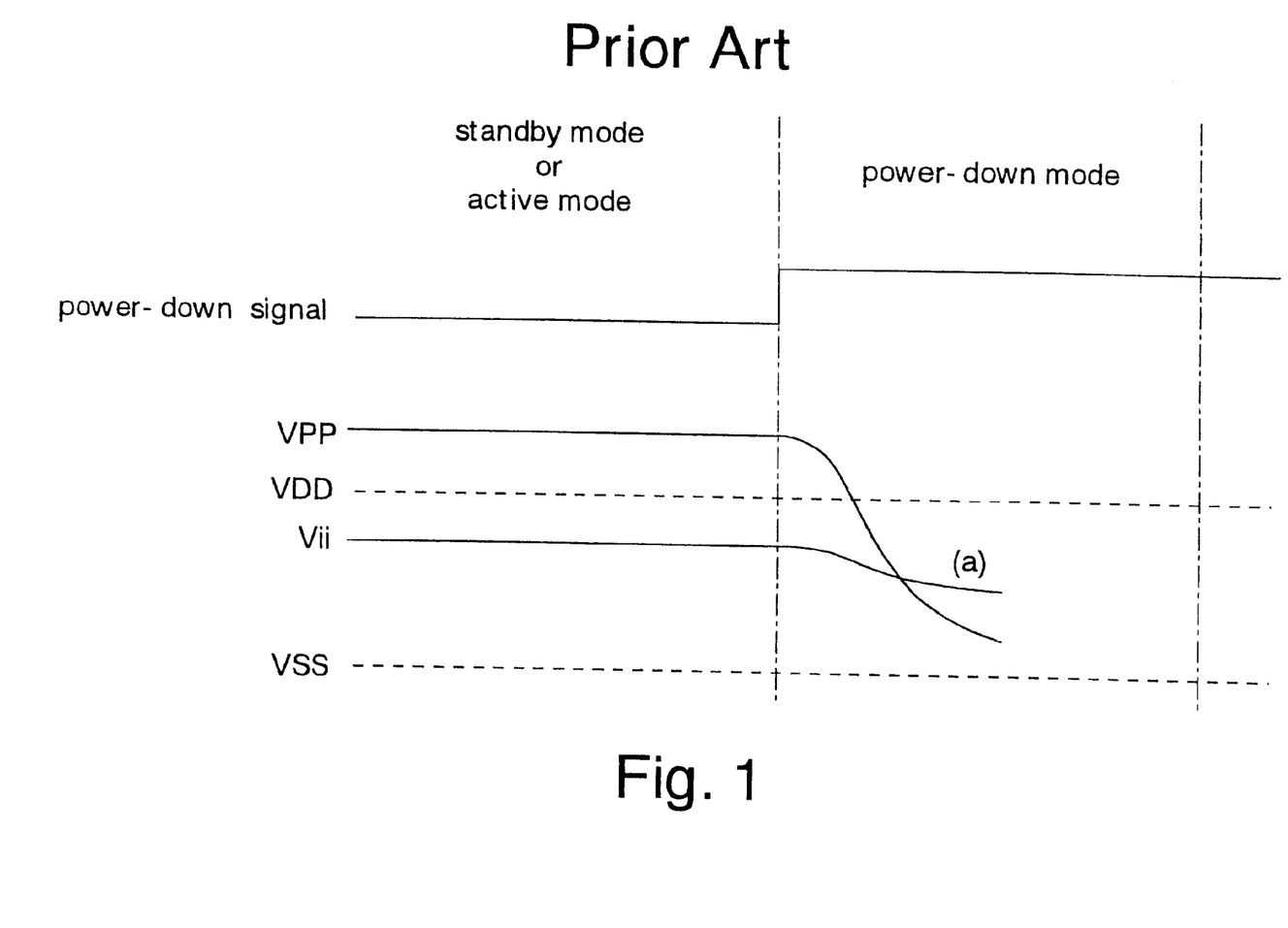
FIG. 1 is an explanatory diagram showing conventional variations of the boosted voltage VPP and the step-down voltage Vii upon shifting from the standby mode to the power-down mode.

FIG. 1 shows variations of internal power supply voltages VPP and Vii (hereinafter, referred to as a boosted voltage VPP and a step-down voltage Vii) upon shifting from the standby mode to the power-down mode. Depending on the configuration of the leak paths, the boosted voltage VPP may drop earlier than the step-down voltage Vii so that the boosted voltage VPP falls below the step-down voltage Vii (FIG. 1(a)). Here, some circuits receiving the boosted voltage VPP and the step-down voltage Vii can cause a malfunction. Incidentally, the configuration of the leak paths depends on the substrate structure of the semiconductor integrated circuit, the circuit layout thereof, and so on.

Figure 2:
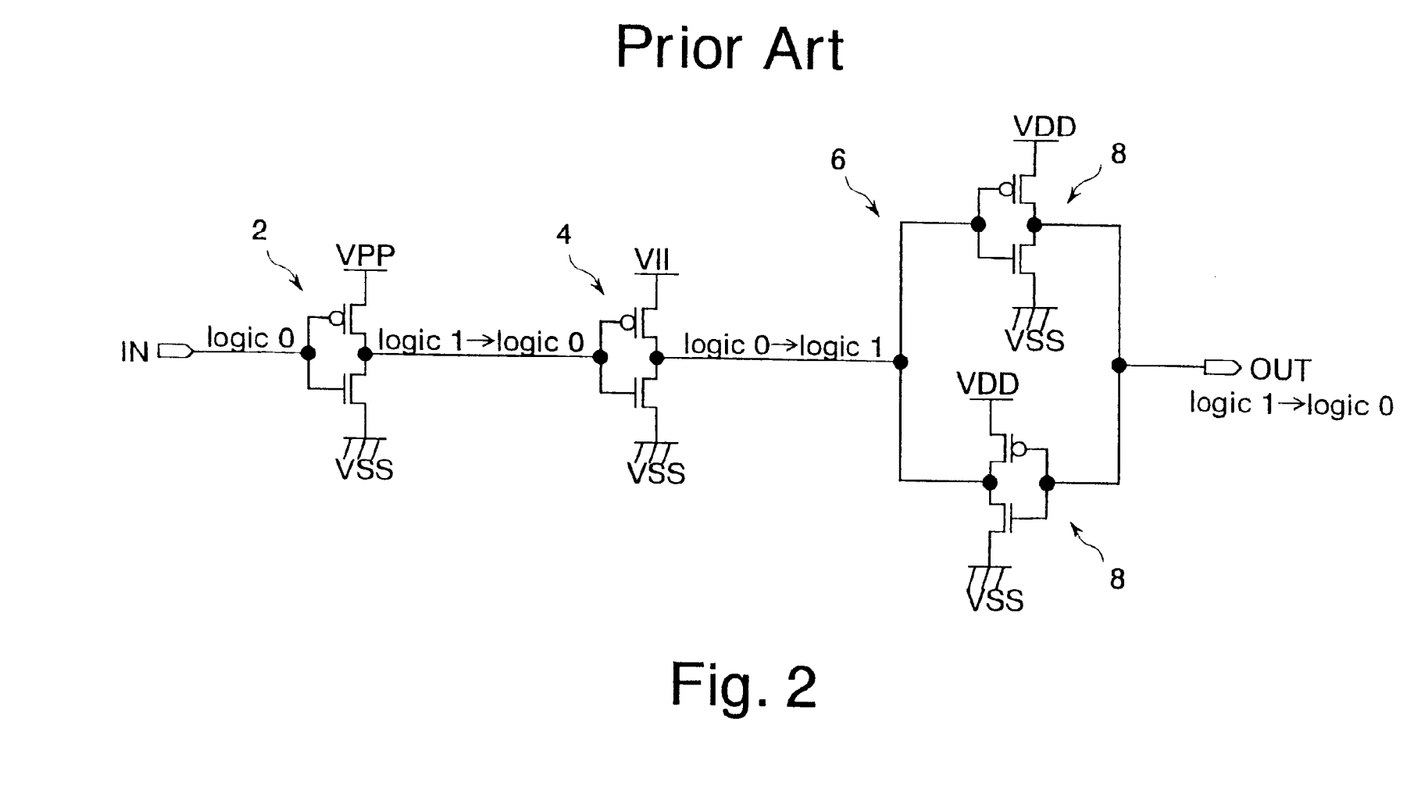
FIG. 2 is an explanatory diagram showing an example of the malfunction of a conventional semiconductor integrated circuit.

FIG. 2 shows an example of the malfunction of a semiconductor integrated circuit. This example illustrates a malfunction occurring in CMOS inverters 2, 4 and a latch circuit 6 which are connected in cascades. The pMOS transistor of the CMOS inverter 2 is connected at its source to a boosted power supply line VPP. The pMOS transistor of the CMOS inverter 4 is connected at its source to a step-down power supply line Vii. The latch 6 has two CMOS inverters 8 whose inputs and outputs are connected to each other. The pMOS transistor of each CMOS inverter 8 is connected at its source to an external power supply line VDD.

In the standby mode, an input signal IN shall be logic 0, the output of the CMOS inverter 2 logic 1 (boosted voltage VPP), the output of the CMOS inverter 4 logic 0, and the output OUT of the latch circuit 6 logic 1. When the operation mode of the semiconductor integrated circuit shifts to the power-down mode and the boosted voltage VPP falls below the step-down voltage Vii as shown in FIG. 1(a), the input of the CMOS inverter 4 turns from logic 1 to logic 0. The CMOS inverter 4 outputs logic 1 incorrectly, thereby inverting the data of the latch circuit 6. In other words, the data of the latch circuit 6 to be retained during the power-down mode is corrupted. Consequently, the semiconductor integrated circuit can malfunction when it shifts from the power-down mode to the standby mode or the active mode.

SUMMARY OF THE INVENTION

It is an object of the present invention to prevent a semiconductor integrated circuit from malfunctioning. In particular, the object is to prevent internal circuits of a semiconductor integrated circuit which has a plurality of operation modes from malfunctioning upon switching between the operation modes.

According to one of the aspects of the semiconductor integrated circuit of the present invention, a first voltage generator generates a first internal power supply voltage to be supplied to a first internal power supply line. A second voltage generator generates a second internal power supply voltage to be supplied to a second internal power supply line. A short circuit shorts the first internal power supply line and the second internal power supply line when operations of both the first and second voltage generators are suspended.

For example, the first and second voltage generators generate the first and second internal power supply voltages based on an external power supply voltage, respectively. Besides, for example, the first internal power supply voltage is a boosted voltage higher than the external power supply voltage. The second internal power supply voltage is a step-down voltage lower than the external power supply voltage.

When the first and second voltage generators stop operating, the first and second internal power supply lines become floating. The charges stored in the respective internal power supply lines drain out gradually through leak paths. Here, since the charges are redistributed to both of the internal power supply lines, the first internal power supply voltage and the second internal power supply voltage become equal in value as they drop off.

Thus, for example, when the first internal power supply voltage is higher than the second internal power supply voltage, the first internal power supply voltage will never fall below the second internal power supply voltage after the first and second voltage generators stop operating. Consequently, the first and second internal power supply voltages can be prevented from inversion, and internal circuits connected to both the first and second internal power supply lines respectively can be precluded from malfunctioning.

According to another aspect of the semiconductor integrated circuit of the present invention, the short circuit includes a transistor having one of its source and drain connected to the first internal power supply line and having the other of the source and drain connected to the second internal power supply line. Consequently, the first and second internal power supply lines can be shorted to each other by a simple short circuit.

According to another aspect of the semiconductor integrated circuit of the present invention, a first internal circuit operates in response to receiving the first and second internal power supply voltages, respectively. The semiconductor integrated circuit has a power-down mode for suspending operations of the first and second voltage generators and for stopping the supply of the first and second internal power supply voltages to the first internal circuit. The transistor turns on in response to a power-down control signal indicating the power-down mode. Thus, the first and second internal power supply lines can be shorted quickly in synchronization with the shift to the power-down mode. In addition, the short circuit can be controlled by the simple logic circuit.

According to another aspect of the semiconductor integrated circuit of the present invention, the semiconductor integrated circuit has a power-down mode for suspending operations of the first and second voltage generators and for stopping the supply of the first and second internal power supply voltages to the first internal circuit. The first internal circuit is connected to both the first and second internal power supply lines. A second internal circuit is connected to an external power supply line. The second internal circuit operates in response to an output of the first internal circuit. That is, the second internal circuit receives the external power supply voltage directly, and hence operates even during the power-down mode. The short circuit shorts the first internal power supply line and the second internal power supply line during the power-down mode.

Upon shifting to the power-down mode, the first and second internal power supply voltages drop gradually. Here, since the short circuit shorts the first and second internal power supply lines to each other, the first and second internal power supply voltages are prevented from inversion. On this account, the first internal circuit outputs signals of correct logic without malfunctioning until the first and second internal power supply voltages fall to a predetermined voltage (a voltage which allows circuit operation).

Consequently, the second internal circuit which operates even during the power-down mode can be prevented from malfunctioning in response to an incorrect output from the first internal circuit. As a result, it is possible to prevent the semiconductor integrated circuit from malfunctioning after the release of the power-down mode.

According to another aspect of the semiconductor integrated circuit of the present invention, the semiconductor integrated circuit has a first operation mode and a second operation mode aside from the power-down mode. For example, the first operation mode is a standby mode in which the internal circuits are in a static state. The second operation mode is an active mode in which the internal circuits operate. The first voltage generator has a first voltage generating unit for operating during the first operation mode and a second voltage generating unit for operating during the second operation mode. The second voltage generator has a third voltage generating unit for operating during the first operation mode and a fourth voltage generating unit for operating during the second operation mode.

On the occasion when the semiconductor integrated circuit switches its state from the first operation mode or the second operation mode to the power-down mode, the first and third voltage generating units or the second and fourth voltage generating units stop operating. Then, the short circuit shorts the first and second internal power supply lines. Consequently, even when the semiconductor integrated circuit has the plurality of operation modes, malfunctioning of the internal circuits can be prevented by shorting the first and second internal power supply lines upon shifting to the power-down mode.

According to another aspect of the semiconductor integrated circuit of the present invention, the first voltage generator has a first detecting circuit for operating during the first operation mode to perform feedback control over the first voltage generating unit in accordance with the first internal power supply voltage. The first voltage generator also has a second detecting circuit for operating during the second operation mode to perform feedback control over the second voltage generating unit in accordance with the first internal power supply voltage. The second voltage generator has a third detecting circuit for operating during the first operation mode to perform feedback control over the third voltage generating unit in accordance with the second internal power supply voltage. The second voltage generator also has a fourth detecting circuit for operating during the second operation mode to perform feedback control over the fourth voltage generating unit in accordance with the second internal power supply voltage. Each of the detecting circuits stops its detecting operation during the power-down mode. This can prevent the detecting circuits from doing incorrect detecting operations when the first and second internal power supply lines are shorted and the first and second internal power supply voltages vary during the power-down mode.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 3:
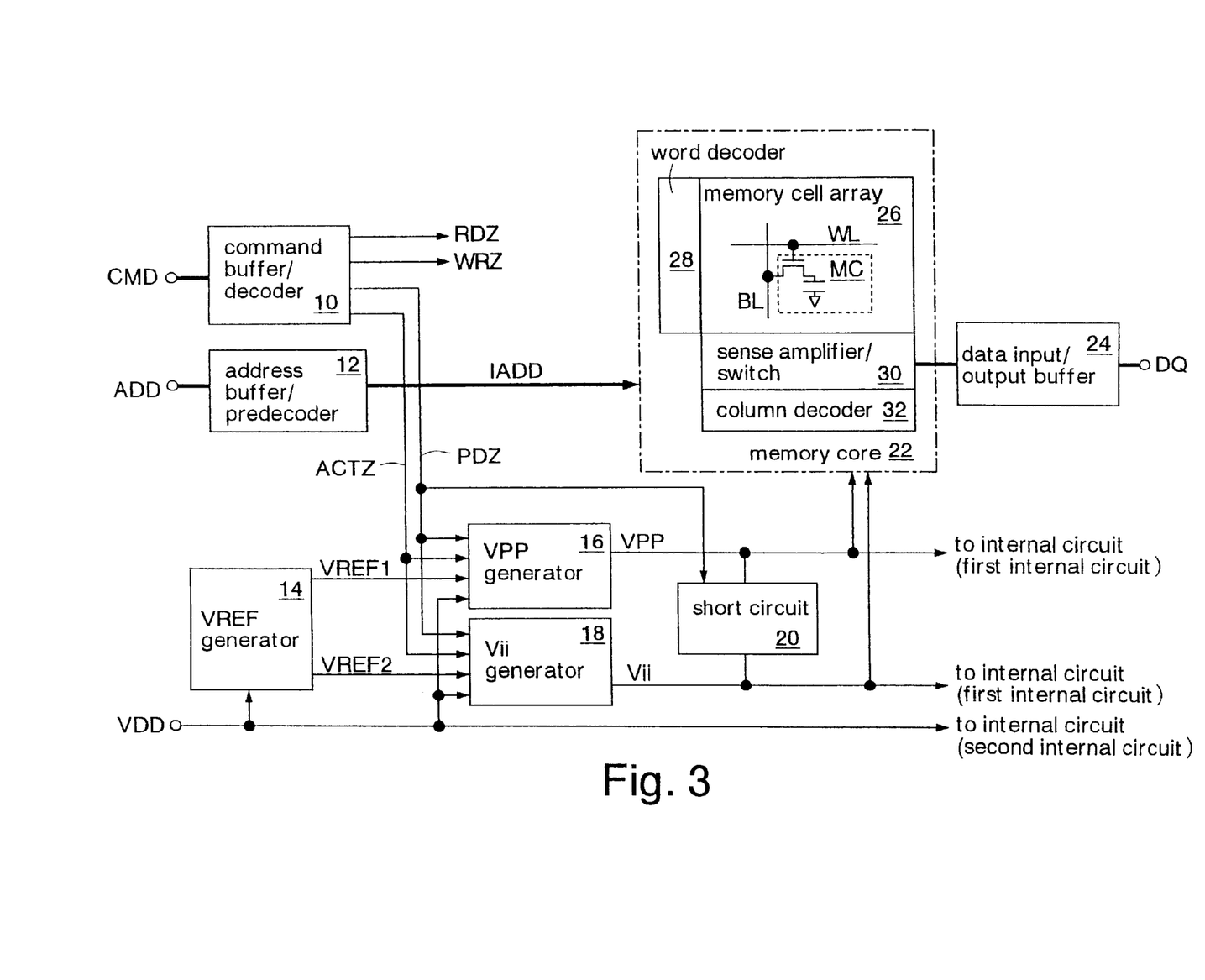
FIG. 3 is a block diagram showing a first embodiment of the semiconductor integrated circuit of the present invention.

FIG. 3 shows a first embodiment of the semiconductor integrated circuit of the present invention. This semiconductor integrated circuit is formed as a DRAM on a silicon substrate by using CMOS processes. The DRAM has the function of refreshing memory cells without being seen from exterior. In addition, the DRAM is tailored to the external terminal specifications and the signal input/output timing specifications of SDRAMs. That is, this DRAM is a pseudo SRAM which functions as an SRAM.

The DRAM has three operation modes. In accordance with commands supplied from the exterior of the chip, the DRAM enters any one of a standby mode (first operation mode), an active mode (second operation mode), and a power-down mode. The standby mode is a period in which no available command is supplied and none of word lines (to be described later) is selected. Among internal circuits, the ones for controlling memory operations (logic circuits excluding input circuits) make no operation here and remain in a static state. The active mode is a period in which the internal circuits operate and word lines are selected for read operations, write operations, and so on. The power-down mode is a period in which the voltage generators for generating internal power supply voltages (VPP and Vii to be described later) stop operating and the internal circuits that receive the internal power supply voltages stop operating.

The DRAM has a command buffer/decoder 10, an address buffer/predecoder 12, a VREF generator 14, a VPP generator 16 (first voltage generator), a Vii generator 18 (second voltage generator), a short circuit 20, a memory core 22, and a data input/output buffer 24. In the diagram, each thick line represents a signal line that consists of a plurality of lines. The white circles at the extremities of signal lines represent external terminals. The signal names ending in "Z" are of positive logic.

The command buffer/decoder 10 receives a command signal CMD (such as a chip enable signal, a write enable signal, and an output enable signal) supplied from the exterior of the DRAM through a command terminal. The command buffer/decoder 10 decodes the signal received, and outputs the resultant as a read control signal RDZ, a write control signal WRZ, an active control signal ACTZ, and a power-down control signal PDZ.

The active control signal ACTZ is activated when a read command for performing a read operation or a write command for performing a write operation is supplied. The read control signal RDZ and the write control signal WRZ are activated corresponding to the activation of the active control signal ACTZ. The power-down control signal PDZ is activated when a power-down command for changing the DRAM to the power-down mode is supplied. Incidentally, the shift to the power-down mode does not necessarily require the input of the power-down command. A power-down signal may be input directly from exterior through a dedicated terminal.

The address buffer/predecoder 12 receives an address signal ADD supplied from the exterior of the DRAM through an address terminal. The address buffer/predecoder 12 predecodes the signal received, and outputs the resultant as an internal address signal IADD.

The VREF generator 14 generates reference voltages VREF1 and VREF2 based on an external power supply voltage VDD (e.g., 2.5 V) supplied through a power supply terminal. The VPP generator 16 generates a boosted voltage VPP (first internal power supply voltage; e.g., 3.3 V) higher than the external power supply voltage VDD based on the reference voltage VREF1 when the active control signal ACTZ or the power-down control signal PDZ is activated. The Vii generator 18 generates a step-down voltage Vii (second internal power supply voltage; e.g., 2 V) lower than the external power supply voltage VDD based on the reference voltage VREF2 when the active control signal ACTZ or the power-down control signal PDZ is activated.

The short circuit 20 shorts a boosted power supply line VPP (first internal power supply line) for supplying the boosted voltage VPP to internal circuits (first internal circuit) and a step-down power supply line Vii (second internal power supply line) for supplying the step-down voltage Vii to internal circuits (first internal circuit) when the power-down control signal PDZ is activated.

The memory core 22 includes a memory cell array 26, a word decoder 28, a sense amplifier/switch 30 and a column decoder 32.

The memory cell array 26 has a plurality of memory cells MC each including a transfer transistor and a capacitor, word lines WL connected to the gates of the transfer transistors in the respective memory cells MC, and bit lines BL connected to the data input/output nodes of the transfer transistors.

The word decoder 28 selects any of the word lines WL in accordance with a row address signal out of the internal address signal IADD. The word line WL selected is supplied with the boosted voltage VPP.

The sense amplifier/switch 30 has not-shown sense amplifiers and column switches. In a read operation, for example, the sense amplifiers amplify data read from the memory cells MC through the bit lines BL. The column switches transmit read data read onto the bit lines BL to the data input/output buffer 24 through data bus lines, and transmit write data supplied through the data bus lines to the bit lines BL.

The column decoder 32 outputs control signals for controlling the column switches in accordance with a column address signal out of the internal address signal IADD.

The data input/output buffer 24 outputs read data through a data terminal DQ, and inputs write data through the data terminal.

Incidentally, the boosted voltage VPP and the step-down voltage Vii each are supplied to the memory core 22 and predetermined internal circuits (first internal circuit). The external power supply voltage VDD is supplied to internal circuits that need to retain data in the power-down mode (second internal circuit including latch circuits, registers, and the like).

Figure 4:
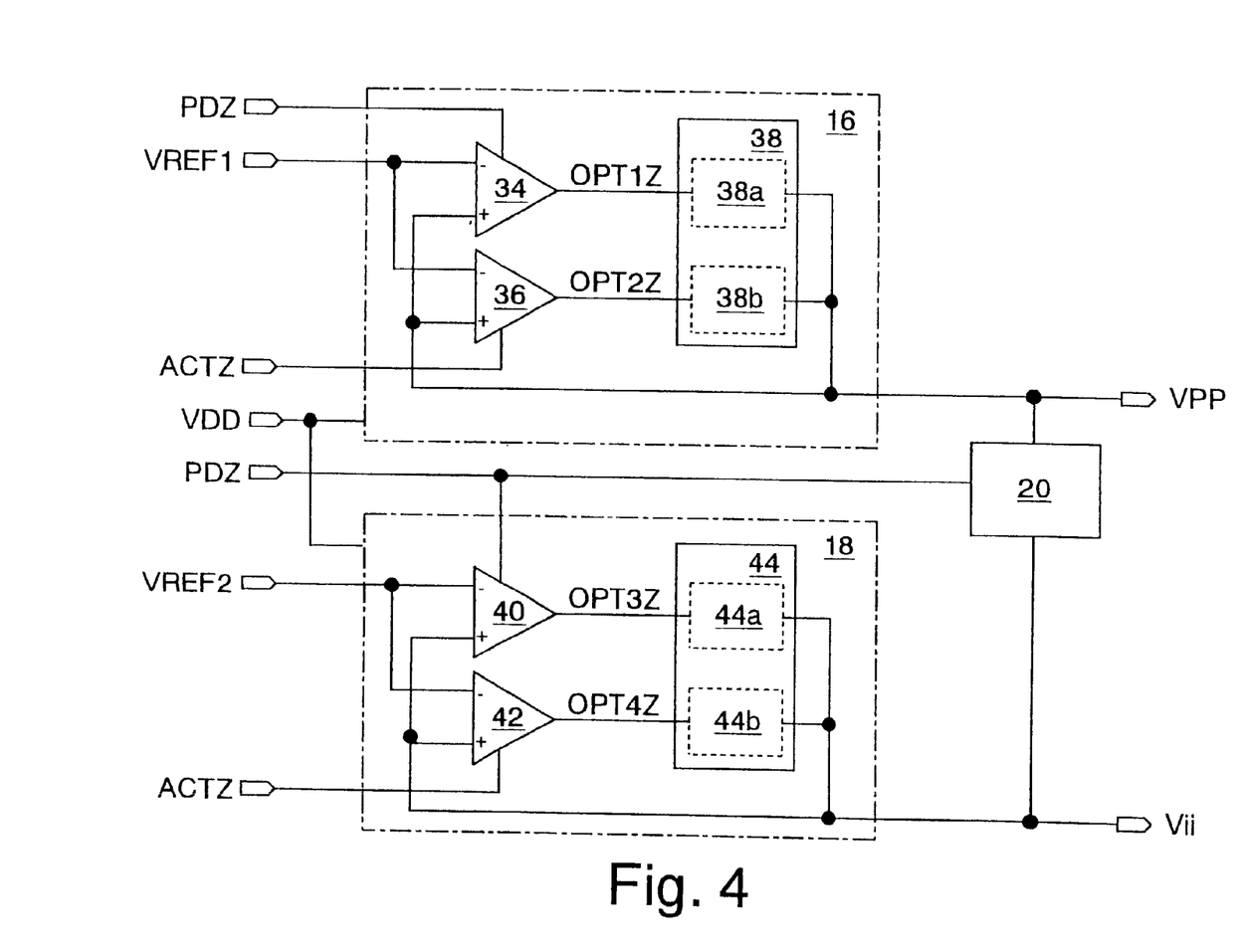
FIG. 4 is a block diagram showing the VPP generator and the Vii generator of FIG. 3.

FIG. 4 shows the VPP generator 16 and the Vii generator 18.

The VPP generator 16 has a VPP detecting circuit 34 (first detecting circuit) for operating in the standby mode, a VPP detecting circuit 36 (second detecting circuit) for operating in the active mode, and a booster circuit 38. The booster circuit 38 includes a boosting unit 38a (first voltage generating unit) for operating in the standby mode and a boosting unit 38b (second voltage generating unit) for operating in the active mode.

The VPP detecting circuit 34 operates when the power-down control signal PDZ is at low level, and activates an operation signal OPT1Z if the boosted voltage VPP is lower than the reference voltage VREF1. That is, the VPP detecting circuit 34 performs feedback control over the boosting unit 38a according to the boosted voltage VPP in the standby mode and in the active mode, and stops operating in the power-down mode.

The VPP detecting circuit 36 operates when the active control signal ACTZ is at high level, and activates an operation signal OPT2Z if the boosted voltage VPP is lower than the reference voltage VREF1. That is, the VPP detecting circuit 36 performs feedback control over the boosting unit 38b according to the boosted voltage VPP in the active mode, and stops operating in the standby mode and in the power-down mode.

The VPP detecting circuits 34 and 36 stop their detecting operations in the power-down mode. This can prevent the VPP detecting circuits 34 and 36 from making incorrect detecting operations when the operation mode shifts to the power-down mode and the boosted voltage VPP varies.

The boosting units 38a and 38b operate when they receive the operation signals OPT1Z and OPT2Z, respectively. The boosting units 38a and 38b boost the external power supply voltage VDD by pumping actions utilizing coupling capacitance, thereby generating the boosted voltage VPP.

The Vii generator 18 has a Vii detecting circuit 40 (third detecting circuit) for operating in the standby mode, a Vii detecting circuit 42 (fourth detecting circuit) for operating in the active mode, and a step-down circuit 44. The step-down circuit 44 includes a step-down unit 44a (third voltage generating unit) for operating in the standby mode and a step-down unit 44b (fourth voltage generating unit) for operating in the active mode.

The Vii detecting circuit 40 operates when the power-down control signal PDZ is at low level, and activates an operation signal OPT3Z if the step-down voltage Vii is higher than the reference voltage VREF2. That is, the Vii detecting circuit 40 performs feedback control over the step-down unit 44a according to the step-down voltage Vii in the standby mode and in the active mode, and stops operating in the power-down mode.

The Vii detecting circuit 42 operates when the active control signal ACTZ is at high level, and activates an operation signal OPT4Z if the step-down voltage Vii is higher than the reference voltage VREF2. That is, the Vii detecting circuit 42 performs feedback control over the step-down unit 44b according to the step-down voltage Vii in the active mode, and stops operating in the standby mode and in the power-down mode.

The Vii detecting circuits 40 and 42 stop their detecting operations in the power-down mode. This can prevent the Vii detecting circuits 40 and 42 from making incorrect detecting operations when the operation mode shifts to the power-down mode and the step-down voltage Vii varies.

The step-down units 44a and 44b operate when they receive the operation signals OPT3Z and OPT4Z, respectively. The step-down units 44a and 44b divide the external power supply voltage VDD by capacitive division or the like to generate the step-down voltage Vii.

Figure 5:
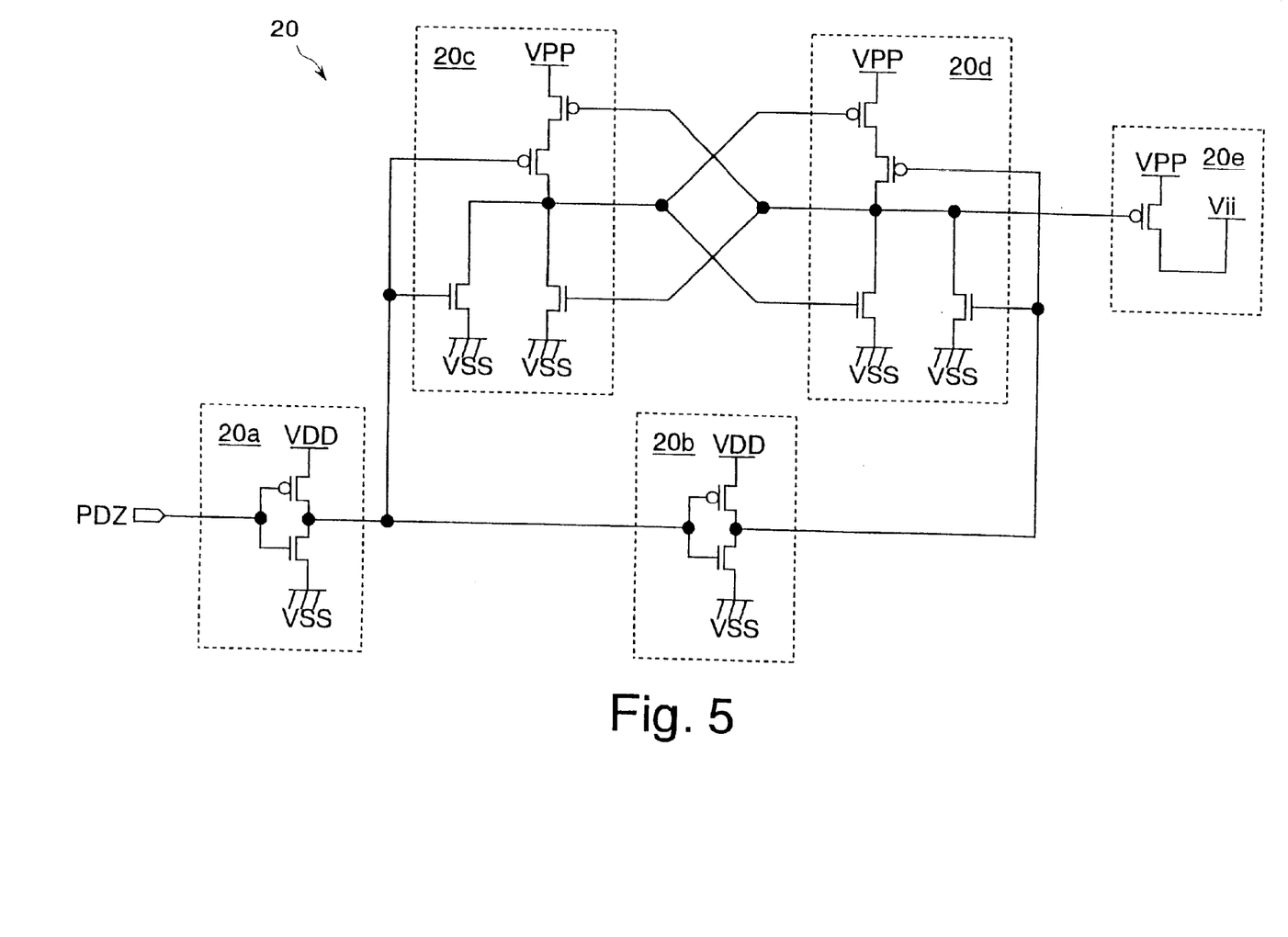
FIG. 5 is a circuit diagram showing the details of the short circuit of FIG. 3.

FIG. 5 shows the details of the short circuit 20. The short circuit 20 includes CMOS inverters 20a and 20b connected in cascade, NOR gates 20c and 20d each having its output fed back to the input of the other, and a pMOS transistor 20e.

The pMOS transistors of the CMOS inverters 20a and 20b are connected at their sources to the external power supply line VDD. The CMOS inverter 20a receives the power-down control signal PDZ.

The NOR gate 20c receives the output of the CMOS inverter 20a and the output of the NOR gate 20d. The NOR gate 20d receives the output of the CMOS inverter 20b and the output of the NOR gate 20c. The sources of pMOS transistors of the CMOS inverters 20a and 20b are connected to the boosted power supply line VPP.

The pMOS transistor 20e is connected to the boosted power supply line VPP at either one of its source and drain, is connected to the step-down power supply line Vii at the other of the source and drain, and receives the output of the NOR gate 20d at its gate. The NOR gate 20d outputs low level whenever the power-down control signal PDZ is at high level. Consequently, while the power-down control signal PDZ is at high level, the pMOS transistor 20e is kept on, shorting the boosted power supply line VPP and the step-down power supply line Vii. That is, the pMOS transistor 20e operates directly under the logic of the power-down control signal PDZ.

Figure 6:
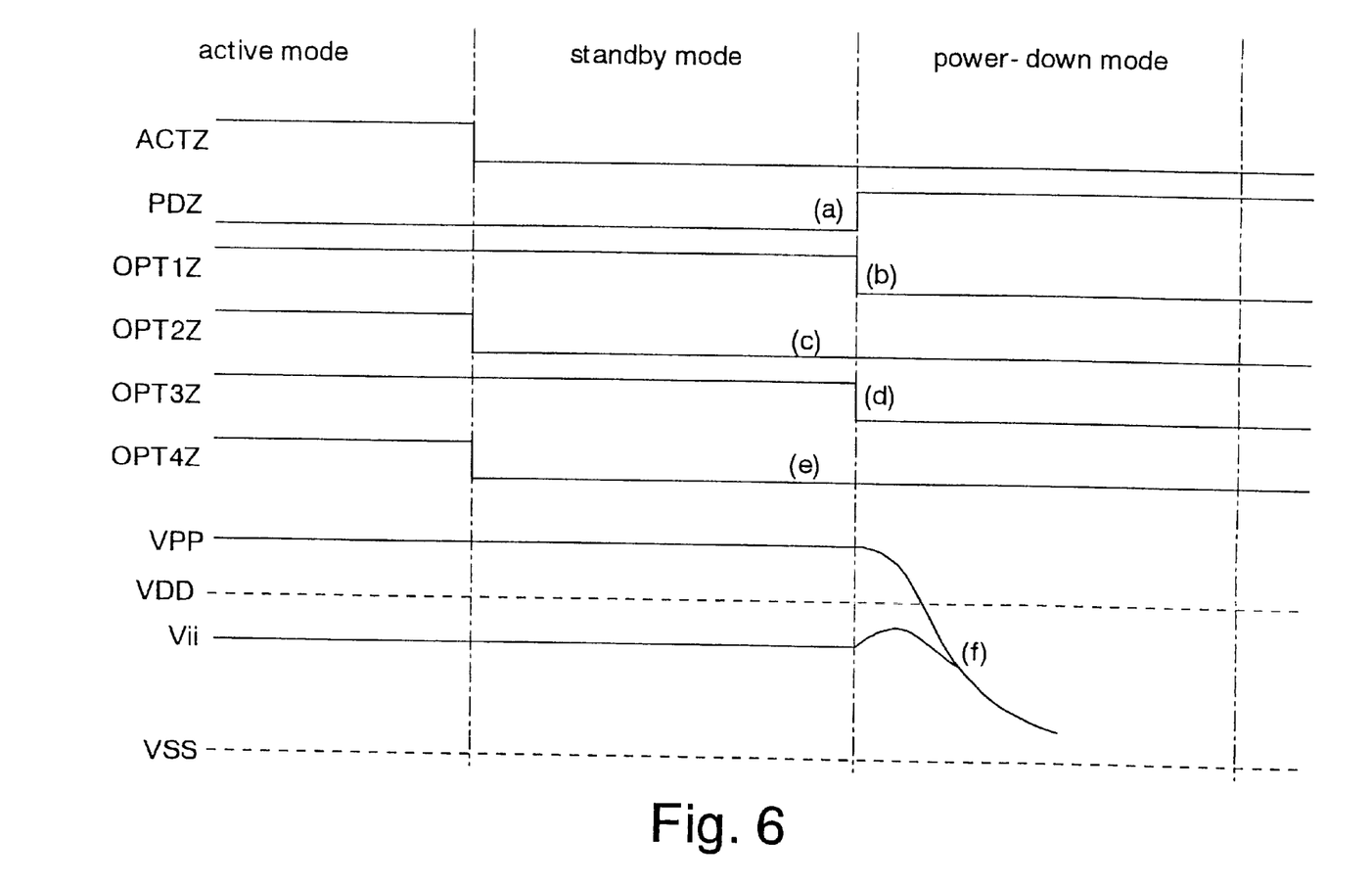
FIG. 6 is an explanatory diagram showing variations of the boosted voltage VPP and the step-down voltage Vii upon shifting from the standby mode to the power-down mode in the first embodiment.

FIG. 6 shows variations of the boosted voltage VPP and the step-down voltage Vii upon shifting from the standby mode to the power-down mode.

In this embodiment, as described above, the DRAM enters the power-down mode when the power-down command is supplied through the command terminal in the standby mode. On this occasion, the command buffer/decoder 10 shown in FIG. 3 turns the power-down control signal PDZ to high level (FIG. 6(a)). In response to the power-down control signal PDZ of high level, the VPP detecting circuit 34 of the VPP generator 16 shown in FIG. 4 stops its detecting operation and turns the operation signal OPT1Z to low level (FIG. 6(b)). The boosting unit 38a receives the operation signal OPT1Z of low level and stops operating. In the standby mode, the VPP detecting circuit 36 has stopped its detecting operation and been outputting the operation signal OPT2Z of low level (FIG. 6(c)). The boosting unit 38b has thus been suspended.

Similarly, the Vii detecting circuit 40 of the Vii generator 18 stops its detecting operation in response to the power-down control signal PDZ of high level, and turns the operation signal OPT3Z to low level (FIG. 6(d)). The step-down unit 44a receives the operation signal OPT3Z of low level and stops operating. In the standby mode, the Vii detecting circuit 42 has stopped its detecting operation and been outputting the operation signal OPT4Z of low level (FIG. 6(e)). The boosting unit 38b has thus been suspended.

As a result, the switching from the standby mode to the power-down mode causes both the booster circuit 38 and the step-down circuit 44 to stop operating.

The pMOS transistor 20e of the short circuit 20 shown in FIG. 5 turns on in response to the power-down control signal PDZ of high level, thereby shorting the boosted power supply line VPP and the step-down power supply line Vii. As a result, the boosted voltage VPP and the step-down voltage Vii become equal in voltage after a predetermined period, and then drop gradually (FIG. 6(f)). In the standby mode, the boosted voltage VPP is higher than the step-down voltage Vii. This prevents the boosted voltage VPP from falling below the step-down voltage Vii after the booster circuit 38 and the step-down circuit 44 stop operating.

Figure 7:
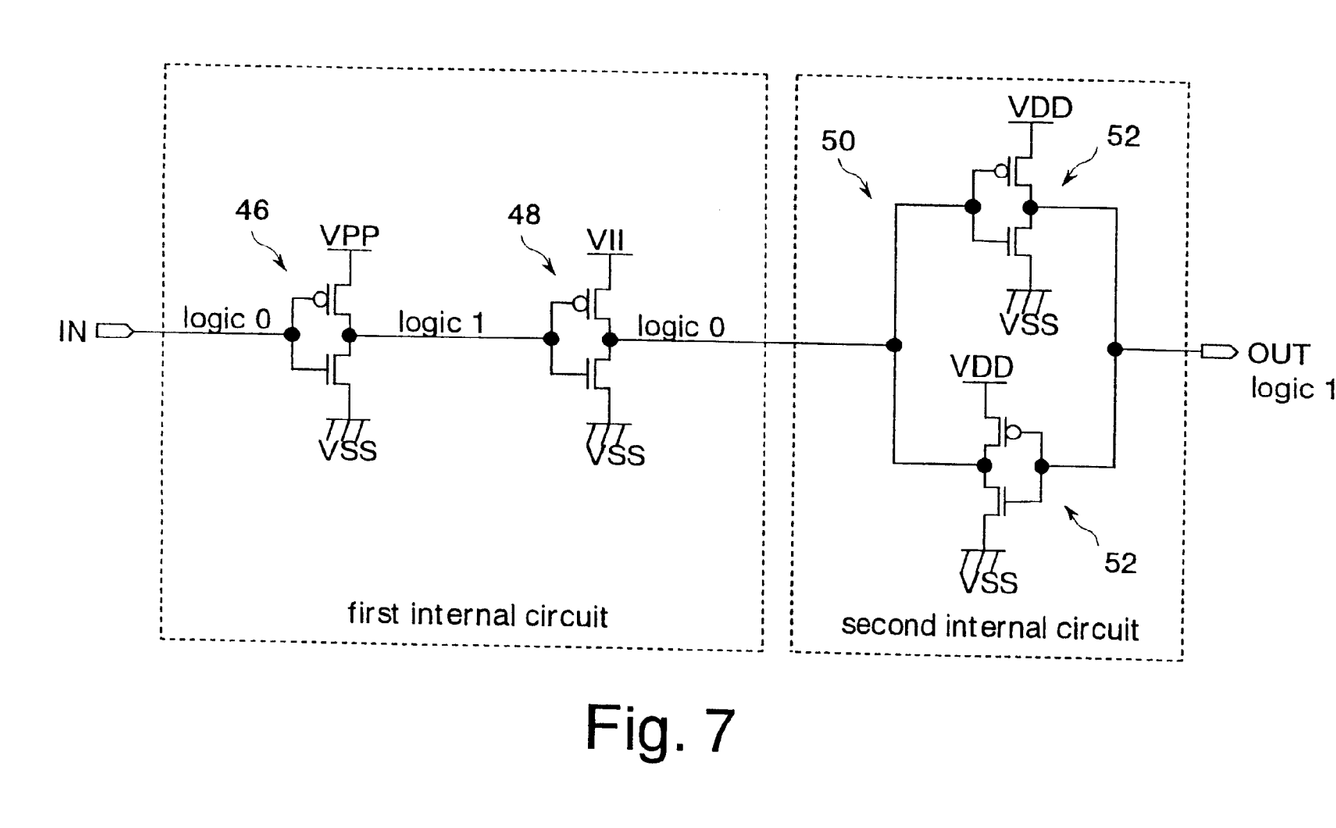
FIG. 7 is a circuit diagram showing an example of the first internal circuit and the second internal circuit.

FIG. 7 shows an example of the first internal circuit and the second internal circuit.

The first internal circuit is formed as cascaded CMOS inverters 46 and 48. The second internal circuit is formed as a latch circuit 50. Description will be given of a malfunction therein. The pMOS transistor of the CMOS inverter 46 is connected at its source to the boosted power supply line VPP. The pMOS transistor of the CMOS inverter 48 is connected at its source to the step-down power supply line Vii. The latch 50 has two CMOS inverters 52 whose inputs and outputs are connected to each other. The pMOS transistor of each CMOS inverter 52 is connected at its source to the external power supply line VDD.

In the standby mode, an input signal IN is logic 0, the output of the CMOS inverter 46 logic 1 (boosted voltage VPP), the output of the CMOS inverter 48 logic 0, and the output OUT of the latch circuit 50 logic 1.

When the operation mode shifts from the standby mode to the power-down mode, the short circuit 20 shorts the boosted power supply line VPP and the step-down power supply line Vii to each other. Thus, the boosted voltage VPP will never fall below the step-down voltage Vii. Consequently, the CMOS inverters 46 and 48 output the signals of correct logic without a malfunction until the boosted voltage VPP and the step-down voltage Vii drop to a predetermined voltage (a voltage which allows circuit operation). This precludes the latch circuit 50 from malfunctioning due to the reception of an incorrect output from the CMOS inverter 48. Since the data of the latch circuit 50 to be retained during the power-down mode is prevented from inversion, the DRAM operates normally when the operation mode shifts from the power-down mode to the standby mode or active mode.

As has been described, according to the present embodiment, the boosted power supply line VPP and the step-down power supply line Vii are shorted to each other by the short circuit 20 in the power-down mode. This can prevent the boosted voltage VPP from falling below the step-down voltage Vii. Thus, the first internal circuit connected to both the boosted power supply line VPP and the step-down power supply line Vii outputs signals of correct logic without a malfunction. As a result, the second internal circuit which operates even in the power-down mode can be prevented from malfunctioning due to the reception of an incorrect output from the first internal circuit. Since the second internal circuit will not malfunction, the DRAM can be prevented from malfunctioning after the release of the power-down mode.

Even in the presence of the plurality of operation modes, malfunctions of the internal circuits can be prevented by shorting the boosted power supply line VPP and the step-down power supply line Vii upon shifting to the power-down mode.

Either one of the source and drain of the pMOS transistor 20e is connected to the boosted power supply line VPP. The other of the source and drain of the pMOS transistor 20e is connected to the step-down power supply line Vii. This makes it possible for the simple short circuit 20 to short the boosted power supply line VPP and the step-down power supply line Vii.

Since the gate of the pMOS transistor 20e is controlled directly by the logic of the power-down control signal PDZ, the boosted power supply line VPP and the step-down power supply line Vii can be shorted quickly.

Figure 8:
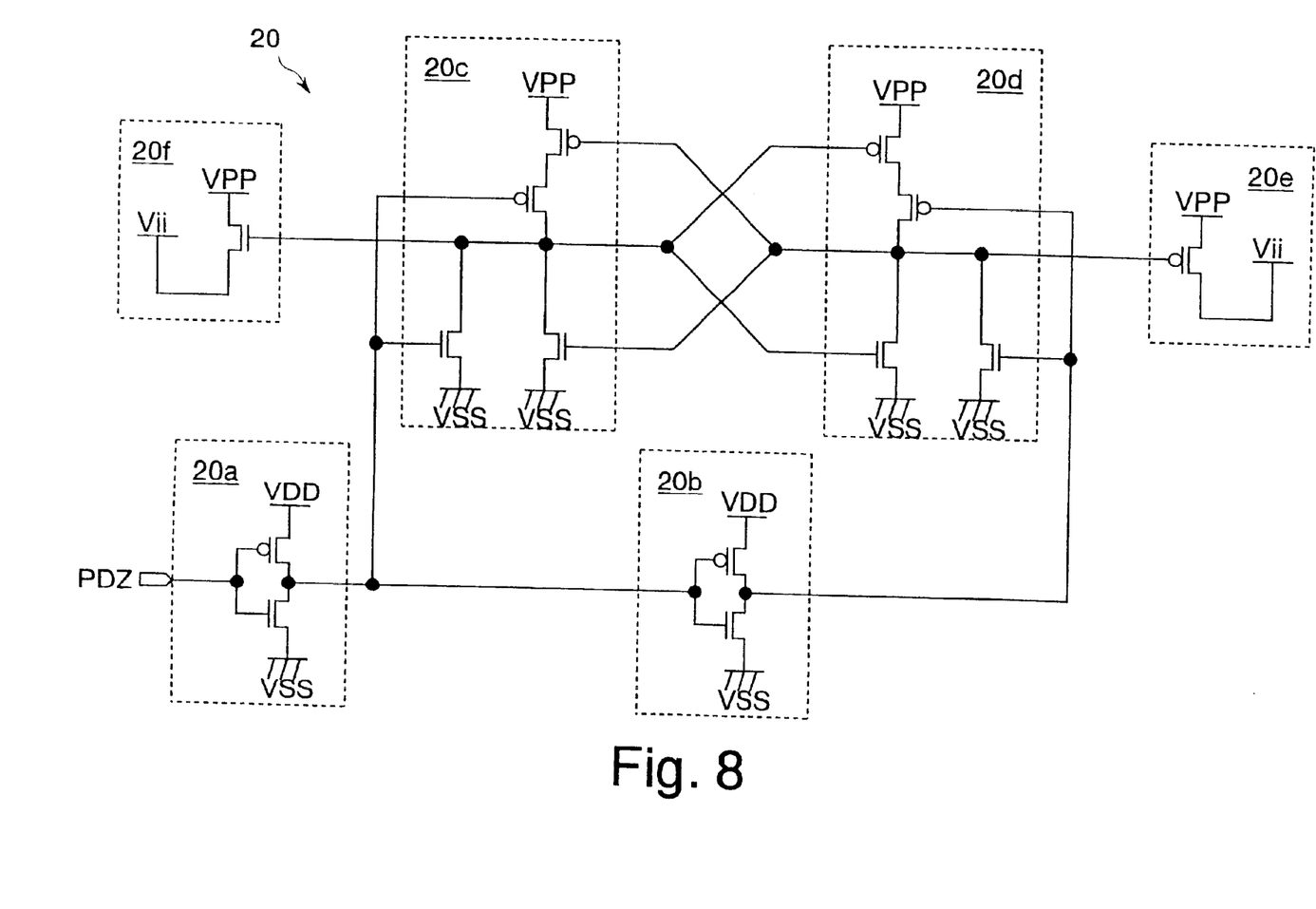
FIG. 8 is a circuit diagram showing the details of the short circuit in the second embodiment.

FIG. 8 shows a second embodiment of the semiconductor integrated circuit of the present invention. The same circuits and signals as those described in the first embodiment will be designated by identical reference numbers or symbols. Detailed description thereof will be omitted here.

This embodiment is constituted by adding an nMOS transistor 20f to the short circuit 20 of the first embodiment. The other configuration is identical to that of the first embodiment. That is, this semiconductor integrated circuit is formed as a DRAM on a silicon substrate by using CMOS processes. The DRAM is a pseudo SRAM which functions as an SRAM.

The nMOS transistor 20f is connected to the boosted power supply line VPP at either one of its source and drain, is connected to the step-down power supply line Vii at the other of the source and drain, and receives the output of the NOR gate 20c at its gate.

The NOR gate 20c outputs high level whenever the power-down control signal PDZ is at high level. Consequently, while the power-down control signal PDZ is at high level, the nMOS transistor 20f is kept on, shorting the boosted power supply line VPP and the step-down power supply line Vii. That is, the nMOS transistor 20f operates directly under the logic of the power-down control signal PDZ.

This embodiment can offer the same effects as those of the first embodiment described above. Besides, in this embodiment, the boosted power supply line VPP and the step-down power supply line Vii are shorted by using the pMOS transistor 20e and the nMOS transistor 20f. Consequently, on shifting to the power-down mode, the boosted power supply line VPP and the step-down power supply line Vii can be equalized in voltage quickly.

The foregoing embodiments have dealt with the cases where the present invention is applied to a DRAM that functions as a pseudo SRAM. However, the present invention is not limited to such embodiments. For example, the present invention may be applied to clock synchronous SDRAMs. The present invention may also be applied to such semiconductor integrated circuits as microcomputers, logic LSIs, and system LSIs.

The invention is not limited to the above embodiments and various modifications may be made without departing from the spirit and scope of the invention. Any improvement may be made in part or all of the components.

What is claimed is:

1. A semiconductor integrated circuit comprising:
   a first voltage generator for generating a first internal power supply voltage to be supplied to a first internal power supply line;
   a second voltage generator for generating a second internal power supply voltage to be supplied to a second internal power supply line; and
   a short circuit for shorting said first internal power supply line and said second internal power supply line which are in a floating state when operations of both said first and second voltage generators are suspended.

2. The semiconductor integrated circuit according to claim 1, wherein
   said short circuit includes a transistor having one of a source and a drain of said transistor connected to said first internal power supply line and having the other of said source and drain connected to said second internal power supply line.

3. The semiconductor integrated circuit according to claim 2, comprising:
   a first internal circuit connected to said first and second internal power supply lines; and
   a power-down mode for suspending operations of said first and second voltage generators and for stopping the supply of said first and second internal power supply voltages to said first internal circuit, wherein
   said transistor turns on in response to a power-down control signal indicating said power-down mode.

4. The semiconductor integrated circuit according to claim 1, comprising:
   a first internal circuit connected to said first and second internal power supply lines;
   a second internal circuit connected to an external power supply line, which operates in response to an output of said first internal circuit; and
   a power-down mode for suspending operations of said first and second voltage generators and for stopping the supply of said first and second internal power supply voltages to said first internal circuit, wherein said short circuit shorts said first internal power supply line and said second internal power supply line during said power-down mode.

5. A semiconductor integrated circuit comprising:

a first voltage generator for generating a first internal power supply voltage to be supplied to a first internal power supply line;

a second voltage generator for generating a second internal power supply voltage to be supplied to a second internal power supply line;

a short circuit for shorting said first internal power supply line and said second internal power supply line when operations of both said first and second voltage generators are suspended;

a first internal circuit connected to said first and second internal power supply lines;

a second internal circuit connected to an external power supply line, which operates in response to an output of said first internal circuit;

a power-down mode for suspending operations of said first and second voltage generators and for stopping the supply of said first and second internal power supply voltages to said first internal circuit; and a first operation mode and a second operation mode, wherein:

said short circuit shorts said first internal power supply line and said second internal power supply line during said power-down mode;

said first voltage generator has a first voltage generating unit for operating during said first operation mode and a second voltage generating unit for operating during said second operation mode; and said second voltage generator has a third voltage generating unit for operating during said first operation mode and a fourth voltage generating unit for operating during said second operation mode.

6. The semiconductor integrated circuit according to claim 5, wherein:

said first voltage generator has a first detecting circuit for operating during said first operation mode to perform feedback control over said first voltage generating unit in accordance with said first internal power supply voltage, and a second detecting circuit for operating during said second operation mode to perform feedback control over said second voltage generating unit in accordance with said first internal power supply voltage; and said second voltage generator has a third detecting circuit for operating during said first operation mode to perform feedback control over said third voltage generating unit in accordance with said second internal power supply voltage, and a fourth detecting circuit for operating during said second operation mode to perform feedback control over said fourth voltage generating unit in accordance with said second internal power supply voltage.

7. The semiconductor integrated circuit according to claim 5, wherein:

said first operation mode is a standby mode in which said first and second internal circuits are in a static state; and said second operation mode is an active mode in which said first and second internal circuits operate.

8. A semiconductor integrated circuit comprising:

a first voltage generator for generating a first internal power supply voltage to be supplied to a first internal power supply line;

a second voltage generator for generating a second internal power supply voltage to be supplied to a second internal power supply line; and a short circuit for shorting said first internal power supply line and said second internal power supply line when operations of both said first and second voltage generators are suspended, wherein:

said first and second voltage generators generate said first and second internal power supply voltages based on an external power supply voltage, respectively;

said first internal power supply voltage is a boosted voltage higher than said external power supply voltage; and said second internal power supply voltage is a step-down voltage lower than said external power supply voltage.

* * * * *